(12) United States Patent
Ozer et al.

(10) Patent No.: US 11,996,527 B2
(45) Date of Patent: May 28, 2024

(54) TECHNIQUE FOR MONITORING A BATTERY CELL

(71) Applicant: Arm Limited, Cambridge (GB)

(72) Inventors: Emre Ozer, Buckden (GB); Remy Pottier, Grenoble (FR); Jedrzej Kufel, Soham (GB); John Philip Biggs, Cambridge (GB); James Edward Myers, Great Wilbraham (GB)

(73) Assignee: Arm Limited, Cambridge (GB)

( * ) Notice: Subject to any disclaimer, the term of this patent is extended or adjusted under 35 U.S.C. 154(b) by 153 days.

(21) Appl. No.: 17/541,000

(22) Filed: Dec. 2, 2021

(65) Prior Publication Data
US 2023/0178819 A1    Jun. 8, 2023

(51) Int. Cl.
*H01M 10/48*    (2006.01)
*G01R 31/392*   (2019.01)

(52) U.S. Cl.
CPC ........ *H01M 10/482* (2013.01); *G01R 31/392* (2019.01)

(58) Field of Classification Search
CPC ..... H01M 10/482; G01R 31/392; Y02E 60/10
See application file for complete search history.

(56) References Cited

U.S. PATENT DOCUMENTS

| | | | |
|---|---|---|---|
| 9,195,232 B1 * | 11/2015 | Egnor .................. | G05D 1/0055 |
| 2018/0151918 A1 * | 5/2018 | Boovaragavan .. | H01M 10/0436 |
| 2020/0313152 A1 * | 10/2020 | Stefanopoulou .... | H01M 50/578 |
| 2021/0286017 A1 * | 9/2021 | Hom ..................... | G01R 31/392 |

FOREIGN PATENT DOCUMENTS

| | | |
|---|---|---|
| JP | 2012-68116 | 4/2012 |
| WO | 2020/104892 | 5/2020 |
| WO | 2020/197015 | 10/2020 |

OTHER PUBLICATIONS

Koch, et al., "Fast Thermal Runaway Detection for Lithium-Ion Cells in Large Scale Traction Batteries", Batteries, vol. 4, No. 16, Mar. 27, 2018, pp. 1-11 (11pp.).
Combined Search and Examination Report for GB Application No. 2214671.6 dated Mar. 31, 2023, 6 pages.

* cited by examiner

*Primary Examiner* — Catherine T. Rastovski
*Assistant Examiner* — Lal C Mang
(74) *Attorney, Agent, or Firm* — NIXON & VANDERHYE P.C.

(57) ABSTRACT

A battery cell monitoring system comprises a flexible substrate able to conform to a surface of a battery cell to be monitored, and a plurality of first-level prediction units integrated onto the flexible substrate, where each first-level prediction unit is positioned at a different location on the flexible substrate to each other first-level prediction unit. Each first-level prediction unit comprises at least one sensor to generate sensor signals indicative of a physical state of the battery cell, and first-level prediction circuitry to generate a predicted battery cell status value in dependence on the sensor signals received from the at least one sensor of that first-level prediction unit. Second-level prediction circuitry is arranged to determine a prediction result in dependence on the predicted battery cell status values generated by the first-level prediction circuitry of each first-level prediction unit, and a communications device is used to output the prediction result at least when the prediction result indicates an occurrence of a critical event.

23 Claims, 10 Drawing Sheets

TECHNIQUE FOR MONITORING A BATTERY CELL

BACKGROUND

The present technique relates to the monitoring of battery cells, and in particular relates to the provision of a battery cell monitoring system, a battery pack including one or more battery cell monitoring systems, and methods of operation of the same.

An electric battery, for example a rechargeable electric battery, may be used as an energy storage medium in a wide range of applications, such as in the case of an electric vehicle battery (EVB), where the electric vehicle may take a wide variety of forms, such as cars, scooters, bikes, as well as other industrial or consumer devices. An electric battery usually consists of several battery cells organised into a battery module, and several battery modules organised into a battery pack. The battery pack may be provided with electronic circuitry supporting a battery management system. Such battery packs may be vulnerable to disruptive or even dangerous events such as thermal runaway (a rapid temperature rise) in one or more of its cells, for example due to a short circuit occurring due to physical shock or overcharging.

SUMMARY

In a first example implementation, there is provided a battery cell monitoring system comprising: a flexible substrate able to conform to a surface of a battery cell to be monitored; a plurality of first-level prediction units integrated onto the flexible substrate, where each first-level prediction unit is positioned at a different location on the flexible substrate to each other first-level prediction unit, and each first-level prediction unit comprises at least one sensor to generate sensor signals indicative of a physical state of the battery cell and first-level prediction circuitry to generate a predicted battery cell status value in dependence on the sensor signals received from the at least one sensor of that first-level prediction unit; second-level prediction circuitry arranged to determine a prediction result in dependence on the predicted battery cell status values generated by the first-level prediction circuitry of each first-level prediction unit; and a communications device to output the prediction result at least when the prediction result indicates an occurrence of a critical event.

In another example implementation, there is provided a battery pack comprising: a plurality of battery modules, wherein each battery module comprises a plurality of battery cells and wherein at least one of the plurality of battery cells comprises the battery cell monitoring system in accordance with the above-mentioned first example implementation; and a battery pack management system comprising reception circuitry configured to receive each prediction result transmitted by the communications device of the battery cell monitoring system.

In a further example implementation, there is provided a method of monitoring a battery cell, comprising: providing a flexible substrate able to conform to a surface of the battery cell; integrating a plurality of first-level prediction units onto the flexible substrate, where each first-level prediction unit is positioned at a different location on the flexible substrate to each other first-level prediction unit; generating sensor signals from at least one sensor provided in each first-level prediction unit, where the sensor signals are indicative of a physical state of the battery cell; employing first-level prediction circuitry in each first-level prediction unit to generate a predicted battery cell status value in dependence on the sensor signals received from the at least one sensor of that first-level prediction unit; employing second-level prediction circuitry to determine a prediction result in dependence on the predicted battery cell status values generated by the first-level prediction circuitry of each first-level prediction unit; and outputting the prediction result at least when the prediction result indicates an occurrence of a critical event.

In a still further example implementation, there is provided a non-transitory computer-readable medium to store computer-readable code for fabrication of an apparatus to form a battery cell monitoring system comprising: a flexible substrate able to conform to a surface of a battery cell to be monitored; a plurality of first-level prediction units integrated onto the flexible substrate, where each first-level prediction unit is positioned at a different location on the flexible substrate to each other first-level prediction unit, and each first-level prediction unit comprises at least one sensor to generate sensor signals indicative of a physical state of the battery cell and first-level prediction circuitry to generate a predicted battery cell status value in dependence on the sensor signals received from the at least one sensor of that first-level prediction unit; second-level prediction circuitry arranged to determine a prediction result in dependence on the predicted battery cell status values generated by the first-level prediction circuitry of each first-level prediction unit; and a communications device to output the prediction result at least when the prediction result indicates an occurrence of a critical event.

BRIEF DESCRIPTION OF THE DRAWINGS

The present technique will be described further, by way of illustration only, with reference to examples thereof as illustrated in the accompanying drawings, in which.

DESCRIPTION OF EXAMPLES

Figure 1:
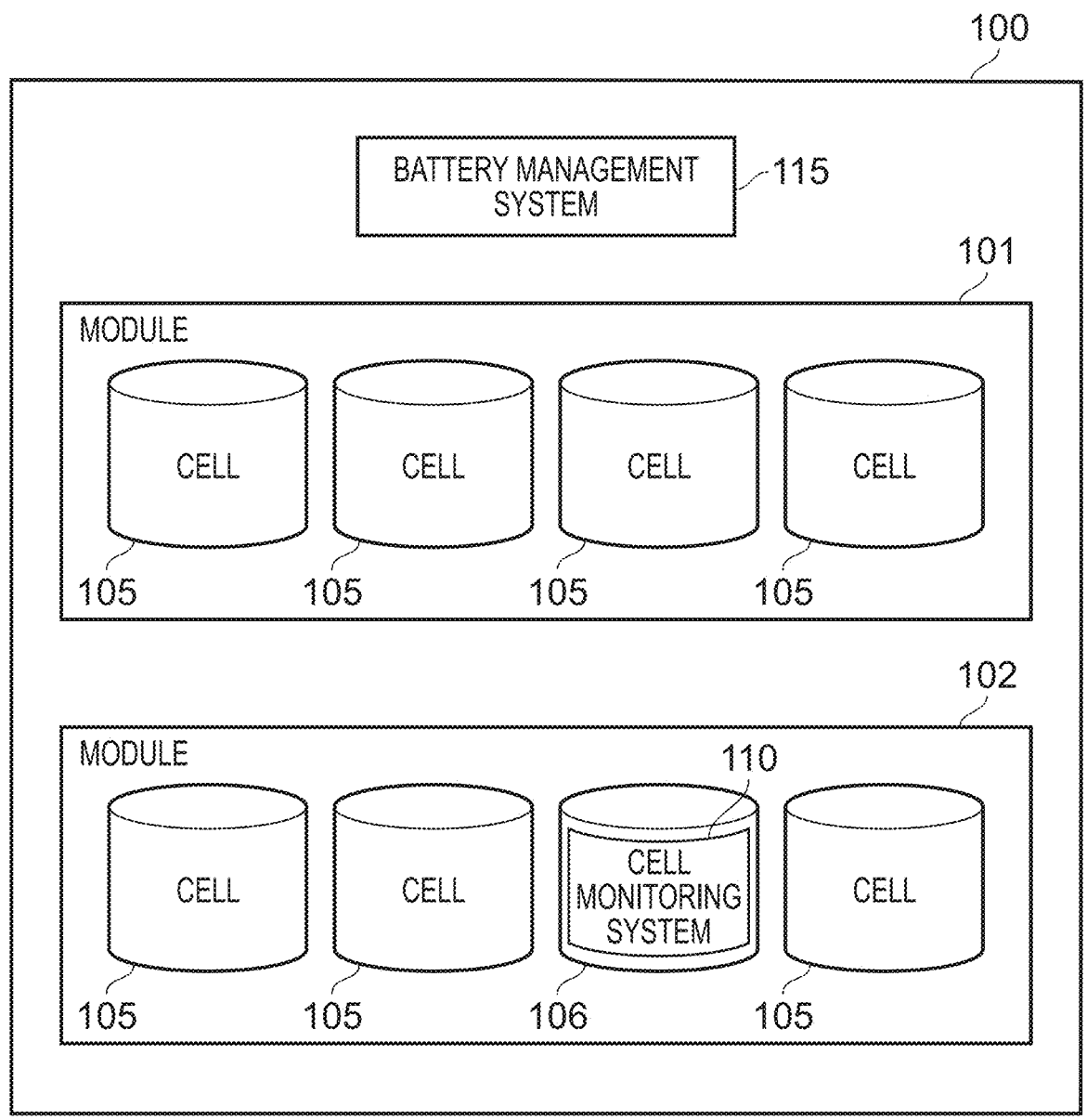
FIG. 1 schematically illustrates a battery pack according to some disclosed examples comprising a battery management system and multiple battery modules, wherein each battery module comprises multiple battery cells and at least one battery cell is provided with a battery cell monitoring system.

Where previous approaches to battery management have focused on the battery pack or battery module level, the present disclosure proposes the provision of monitoring capability at the battery cell level. From the viewpoint of considering a battery pack or a battery module, a battery cell can be viewed of as the basic building block, with battery modules being formed of multiple battery cells, and in turn battery packs being formed of one or more battery modules. For the purposes of the present technique, the internal structure of the battery cell is not relevant, and the battery cell can be viewed as a black box with associated electrodes, forming the smallest battery component employed within the battery module or battery pack.

In accordance with the technique described herein, a battery cell monitoring system is provided that comprises a flexible substrate able to conform to a surface of the battery cell to be monitored. A plurality of first-level prediction units are integrated onto the flexible substrate, with each first-level prediction unit being positioned at a different location on the flexible substrate to each other first-level prediction unit. Each first-level prediction unit comprises at least one sensor to generate sensor signals indicative of a physical state of the battery cell, and first-level prediction circuitry to generate a predicted battery cell status value in dependence on the sensor signals received from the at least one sensor of that first-level prediction unit. There are a number of ways in which the first-level prediction circuitry may generate a predicted battery cell status value in dependence on the received sensor signals. For example, such an operation may involve analysing the discrete sensor signals received at a particular point in time, or alternatively may be based on an analysis of sensor signals received from each of the sensors over a period of time.

The current technique makes use of recent developments that allow a data processing apparatus to be fabricated on the basis of a flexible substrate, with the components of the data processing apparatus being integrated onto the flexible substrate, for example by printing the components onto the flexible substrate (although the techniques described herein are not limited to such printing techniques, and any suitable technique for integrating the components onto the flexible substrate may be used). It has been realised by the inventors of the present techniques that through use of such technology, "intelligent" monitoring of an electric battery can advantageously be implemented at the battery cell level in a cost effective manner.

Since the first-level prediction units are integrated onto the flexible substrate, then they can be positioned adjacent to the surface of the battery cell, allowing the sensor signals generated by the one or more sensors of each first-level prediction unit to detect a physical state of the battery cell local to that first-level prediction unit. Further, since each first-level prediction unit is positioned at a different location on the flexible substrate, then the use of the multiple first-level prediction units allows information indicative of the physical state of the battery cell to be obtained from multiple different locations on the battery cell.

Further, the battery cell monitoring system in accordance with the techniques described herein also includes second-level prediction circuitry that is arranged to determine a prediction result in dependence on the predicted battery cell status values generated by the first-level prediction circuitry of each first-level prediction unit. The battery cell monitoring system also includes a communication device that can be caused to output the prediction result at least when the prediction result indicates an occurrence of a critical event. The prediction result can for example be output to a controller provided in association with a group of battery cells that includes the cell being monitored by the battery cell monitoring system, and by way of specific example the controller may be provided in association with a battery module or a battery pack. The controller (which may also be referred to herein as a battery management system (BMS)) can then take into account the prediction result received from the battery cell monitoring system when performing its battery management functions. The battery management functions performed by the BMS may vary dependent on implementation, and what those functions are is not relevant to the battery cell monitoring techniques described herein.

As will be apparent from the above discussion, by employing the techniques described herein, the predicted battery cell status values produced by the various first-level prediction units can be monitored by the second-level prediction circuitry, with that predicted battery cell status value information being collectively used to make a prediction of the current physical state of the battery cell. It has been found that by such an approach the physical state of a battery cell can be closely monitored, and a number of different potential critical events can be detected early, thus providing a significantly improved system for monitoring the state of battery cells.

By using the techniques described herein, various electric battery management actions may be taken in dependence on the battery cell status predictions made by the second-level prediction circuitry, potentially at the individual battery cell level, but also at the battery module level, or even at the entire battery pack level, to ensure the ongoing healthy operation of the electric battery, and ideally to avoid undesirable events such as the above-mentioned thermal runaway from occurring, or alternatively to take damage limiting and/or safety enhancing actions in response. Although not limited to these use-cases, the disclosed battery cell monitoring system may for example be employed for the purposes of (early) thermal runaway detection, for charging/discharging monitoring and optimisation, and for battery cell lifecycle health status management for future recycling or re-use of the battery cell.

As noted above, each first-level prediction unit is integrated onto the flexible substrate. Whilst in principle the second-level prediction circuitry and the communications device may be provided as separate components that are not integrated onto the flexible substrate, it can also be beneficial for one or both of the second-level prediction circuitry and the communications device to be integrated onto the flexible substrate. In particular, this can lead to a particularly compact form of the battery cell monitoring system, for example allowing the entire battery cell monitoring system to be applied to a surface of a battery cell. This can be particularly beneficial in some example implementations, for example where multiple battery cells are packed in close proximity to each other, as is typically the case when producing the earlier-mentioned battery modules used within electric vehicle batteries.

There are a number of ways in which the second-level prediction circuitry may be arranged to determine a prediction result in dependence on the various predicted battery cell status values generated by each of the first-level prediction units. In one example implementation, the second-level prediction circuitry is arranged, responsive to being triggered to determine the prediction result, to determine, for each first-level prediction unit, a current predicted battery cell status based on one or more predicted battery cell status values generated by the first-level prediction circuitry of that first-level prediction unit. It is then arranged to determine the prediction result in dependence on the current predicted battery cell status associated with at least one first-level prediction unit. By default, the prediction result will be determined in dependence on the current predicted battery cell status associated with each first-level prediction unit, but as will be discussed in more detail later, in some instances at least one first-level prediction unit may be determined to be faulty and the current predicted battery cell status for such a first-level prediction unit will then typically be excluded from consideration.

There are various ways in which the second-level prediction circuitry may be triggered to determine the prediction result. However, in one example implementation the trigger may occur at a regular frequency, for example every N clock cycles, where N is an integer greater than or equal to 1.

The current predicted battery cell status determined by the second-level prediction circuitry for each first-level prediction unit can take a variety of forms, but in one example implementation is selected from a set of possible statuses that comprise at least a normal status and one or more critical event statuses, the normal status indicating normal operation of the battery cell, and each critical event status indicating an abnormal behaviour of the battery cell.

Once the second-level prediction circuitry has determined the current predicted battery cell status for each first-level prediction unit, there are a number of ways in which the second-level prediction circuitry can determine the appropriate prediction result based on that information. In one example implementation, when the current predicted battery cell status determined for each first-level prediction unit indicates a normal status, the second-level prediction circuitry is arranged to determine, as the prediction result, the normal status. Further, in one example implementation, when the current predicted battery cell status determined for each first-level prediction unit indicates a same critical event status, the second-level prediction circuitry is arranged to determine, as the prediction result, the same critical event status, and to trigger the communication device to output that prediction result.

However, there are a number of ways in which the second-level prediction circuitry may determine a suitable prediction result when the outputs from the various first-level prediction units are not all the same. In one example implementation, when the current predicted battery cell status determined for at least one first-level prediction unit differs to the current predicted battery cell status determined for at least one other first-level prediction unit, the second-level prediction circuitry is arranged to perform a check operation before determining the prediction result.

The check operation can take a variety of forms, but in one example implementation the check operation implements a procedure to check whether the first-level prediction circuitry of each first-level prediction unit is operating correctly. The second-level prediction circuitry is then arranged, when the check operation determines that the first-level prediction circuitry of each first-level prediction unit is operating correctly, to determine the prediction result using predicted battery cell statuses for each first-level prediction unit. However, when the check operation determines that the first-level prediction circuitry of one or more first-level prediction units is faulty, the second-level prediction circuitry is arranged to exclude predicted battery cell statuses for each faulty first-level prediction unit when determining the prediction result. If desired, the second-level prediction circuitry may also at this stage notify the BMS that a fault has been detected, for example by indicating the one or more first-level prediction units that have been detected as being faulty.

The manner in which the check operation is performed may vary dependent on implementation. However, in one example implementation, each first-level prediction unit may be placed in a test mode when the check operation is performed, and the check operation may be arranged to cause the first-level prediction circuitry of each first-level prediction unit to generate a test mode predicted battery cell status value, where the test mode predicted battery cell status value will specify a reserved value if the first-level prediction circuitry is operating correctly. By way of specific example, when each first-level prediction unit is placed in the test mode, it may be arranged to turn off each of its sensors, and if the first-level prediction circuitry is operating correctly then it may be configured to generate as the test mode predicted battery cell status value a value that indicates that the sensors are turned off. If the test mode predicted battery cell status value takes any other value, then in one example implementation this is used to infer faulty operation of the associated first-level prediction circuitry.

In one example implementation, the second-level prediction circuitry is arranged, when the check operation determines that the first-level prediction circuitry of each first-level prediction unit is operating correctly, to cause each first-level prediction unit to exit the test mode and cause its associated first-level prediction circuitry to generate a further predicted battery cell status value for use by the second-level prediction circuitry in generating the prediction result. This further predicted battery cell status value as received from each first-level prediction unit could be used in isolation by the second-level prediction circuitry to generate the prediction result, or alternatively could be combined with one or more previously generated predicted battery cell status values output by each first-level prediction unit. It will be appreciated that in yet further alternative implementations other approaches could be adopted. For example, rather than using any further predicted battery cell status value, upon detecting that the first-level prediction circuits are all operating correctly the second-level prediction circuitry may be arranged to re-evaluate the previously generated battery cell status values output from each first-level prediction unit. Alternatively, any previously generated values could be ignored, and the second-level prediction circuit could be arranged to await receipt of multiple new predicted battery cell status values from each first-level prediction unit, before determining the prediction result.

In one example implementation, when at least one predicted battery cell status used to determine the prediction result indicates a single critical event and any remaining predicted battery cell statuses used to determine the prediction result indicate the normal state, the second-level prediction circuitry is arranged to identify that single critical event as the prediction result. As noted above, in one example implementation, the first time such a scenario arises the above described check operation will first be performed. If after completion of the check operation, the above scenario still arises then at that point the second-level prediction circuitry can identify the single critical event as the prediction result. In an alternative implementation, the check operation may not be supported, and the above prediction result may be generated the first time such a scenario arises.

In one example implementation, the set of possible statuses include a plurality of critical event statuses indicating different critical events. When the predicted battery cell statuses used to determine the prediction result indicate two or more critical events, the second-level prediction circuitry may be arranged to apply prioritisation criteria to determine which critical event to identify as the prediction result. In an alternative implementation, the second-level prediction circuitry may merely be arranged to indicate each critical event within the prediction result.

In one example implementation where the set of possible statuses include a plurality of critical event statuses indicating different critical events, the plurality of critical event statuses may include at least one special type critical event status that can imply a critical event in either the battery cell or an adjacent battery cell monitored by a further instance of the battery cell monitoring system. In such an example implementation, when at least one predicted battery cell status used to determine the prediction result indicates the at least one special type critical event status, the second-level prediction circuitry is arranged, at least when no higher priority critical event is indicated by any other predicted battery cell status used to determine the prediction result, to employ the communications device to request status information from the further instance of the battery cell monitoring system associated with at least one adjacent battery cell, before determining the prediction result. The status information requested can take a variety of forms. For example, it could take the form of one or more predicted battery cell status values generated by the various first-level prediction circuits within the further instance of the battery cell monitoring system, could take the form of one or more predicted battery cell statuses determined by the second-level prediction circuitry within the further instance of the battery cell monitoring system, or could take the form of the prediction result produced by the second-level prediction circuitry for the adjacent cell if that prediction result is available.

As mentioned earlier, the set of possible statuses from which the second-level prediction circuitry may select a current predicted battery cell status for each first-level prediction unit may include a plurality of critical event statuses indicating different critical events. Those different critical events can take a variety of forms, but in one example implementation comprise one or more of a start of a thermal runaway in the battery cell, a start of a burst in the battery cell, a swelling of the battery cell, and/or a gas leak from the battery cell.

In one example implementation, each first-level prediction unit is arranged to output a series of predicted battery cell status values generated at different points in time by the associated first-level prediction circuitry, and the battery cell monitoring system further comprises, for each first-level prediction unit, a status value storage to hold multiple predicted battery cell status values output by that first-level prediction unit. Each status value storage can in one example implementation be provided as part of a second-level prediction unit incorporating the second-level prediction circuitry, but in other example implementations can be provided at any suitable location, provided the second-level prediction circuitry can access that status value storage.

Each status value storage can be implemented in a variety of ways, but in one example implementation is arranged so as to enable a determination of an order in which each of the multiple predicted battery cell status values were output by the associated first-level prediction unit. By way of specific example, each status value storage may take the form of a queue structure.

There are various ways in which the second-level prediction circuitry can be arranged to determine a current predicted battery cell status for each first-level prediction unit. However, in one example implementation, the second-level prediction circuitry is arranged, responsive to being triggered to determine the prediction result, to perform an analysis operation in respect of each status value storage in order to determine a current predicted battery cell status associated with each first-level prediction unit. The prediction result is then determined in dependence on the current predicted battery cell status associated with at least one first-level prediction unit.

The analysis operation can take a variety of forms. For example, in one implementation the second-level prediction circuitry, for each first-level prediction unit, may merely pop the oldest status value from the associated status value storage and determine the current predicted battery cell status from that popped status value. However, in an alternative implementation the analysis operation performed by the second-level prediction circuitry in respect of each status value storage causes the current predicted battery cell status to be determined in dependence on a pattern of the predicted battery cell status values stored in that status value storage. There are various ways in which the pattern analysis could be performed. For example, the contents of all of the entries, or the most recent M entries, within a status value storage may be reviewed, and any suitable analysis technique could be used to determine the current predicted battery cell status from the status values of those reviewed entries. For example, a majority voting approach could be taken, such that the current predicted battery cell status is that indicated by the most status values being considered from the status value storage, or the analysis operation may be biased towards the most recent status value or status values within the status value storage, for example if those most recent status value or values indicate a critical event.

The sensors provided within each first-level prediction unit can take a variety of forms, but in one example implementation comprise one or more of a temperature sensor, a gas emission sensor, a physical deformation sensor, a humidity sensor, a voltage sensor, and/or a current sensor.

The communications device may be any suitable device for outputting the prediction result. However, in one example implementation the communications device is an optical device. The use of such an optical device can ensure electrical isolation between the battery cell monitoring system and other components (for example other battery cell monitoring systems) within the larger system in which the battery cell monitoring system is incorporated, and also can avoid the output of the prediction results giving rise to any electromagnetic interference within the system.

Whilst in one example implementation the second-level prediction circuitry may be provided by a single second-level prediction unit, in an alternative implementation the second-level prediction circuitry may be provided by multiple second-level prediction units that operate in combination to determine the prediction result. For example, each second-level prediction unit may monitor the same first-level prediction units, and hence operate in a redundant manner with respect to each other, each second-level prediction unit checking with each other second-level prediction unit that their determined prediction results are the same. Alternatively, different second-level prediction units may be associated with different groups of first-level prediction units, with the second-level prediction units communicating with each other to make a collaborative decision as to the appropriate prediction result to report. It will be appreciated that the above are just a couple of examples of how multiple second-level prediction units may be used in combination with the multiple first-level prediction units.

Particular examples will now be described with reference to the figures.

FIG. 1 illustrates a battery pack 100. The battery pack 100 comprises plural battery modules 101, 102, and each battery module comprises plural battery cells 105, 106. Purely for the purposes of clarity of illustration, the battery pack in FIG. 1 is only shown to comprise two battery modules, but the present techniques are in no way limited to this number of battery modules, and battery packs with an arbitrary number of further modules are also contemplated. Similarly, for clarity of illustration the battery modules 101, 102 in FIG. 1 are each shown to comprise four battery cells, but the present techniques described herein are in no way limited to this number of battery cells in a battery module, and battery packs with an arbitrary number of battery cells are contemplated.

Of note in particular in the illustration of FIG. 1 is the battery cell 106, which is shown to comprise a battery cell monitoring system 110. The battery cell monitoring system 110 is formed on a flexible substrate (e.g. a plastic substrate) and at least some of the components of the battery cell monitoring system (which are not shown in FIG. 1) are integrated onto its flexible substrate. It should be noted that only battery cell 106 in FIG. 1 is explicitly shown to comprise a battery cell monitoring system 110, but this is merely for simplicity and clarity of illustration, and any number of the battery cells in a battery module may be provided with such a battery cell monitoring system, and this applies to each of the battery modules in the battery pack. Indeed, in one example implementation multiple of the battery cells will have such a battery cell monitoring system provided in association therewith.

The battery pack further comprises a battery management system (BMS) 115, which is in overall control of the operation of the battery pack. As will be described in more detail with reference to the figures which follow, the battery cell monitoring system 110 may be in communication with the battery management system 115, in order to enhance the control of the operation of the battery pack.

Figure 2:
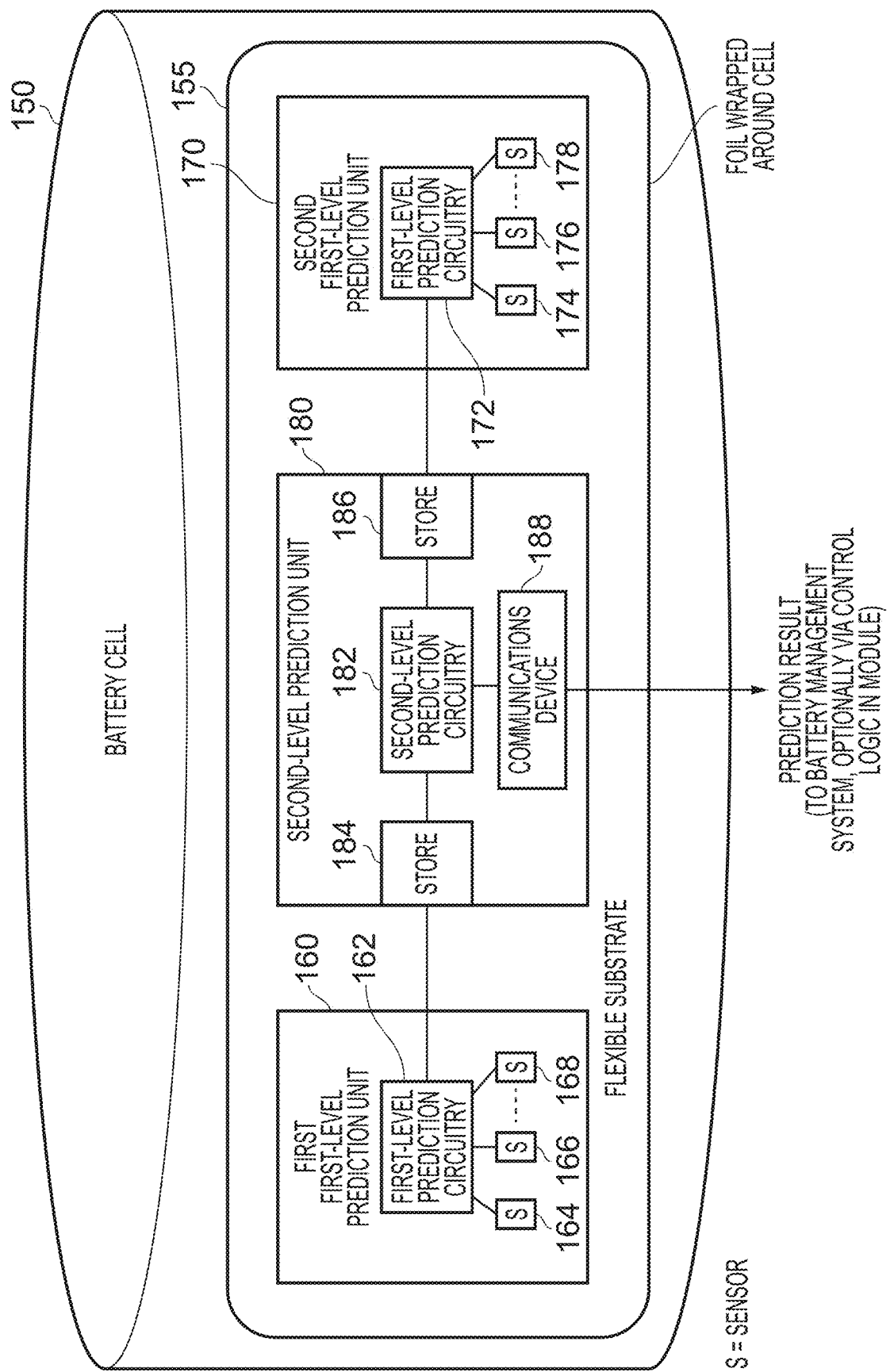
FIG. 2 is a block diagram illustrating components provided within a battery cell monitoring system in accordance with one example implementation.

FIG. 2 is a block diagram illustrating in more detail components provided within the battery cell monitoring system in accordance with one example implementation. In this example, the battery cell monitoring system consists of two first-level prediction units 160, 170, and an associated second-level prediction unit 180. As noted earlier, at least the first-level prediction units are integrated onto a flexible substrate that can be arranged to conform to a surface of a battery cell 150 to be monitored. In this particular example implementation, all of the components of the battery cell monitoring system are integrated onto the flexible substrate, allowing the battery cell monitoring system to be formed as a thin foil 155 that can be applied to, or wrapped around, a surface of the battery cell 150 to be monitored.

The manner in which the various components are integrated onto the flexible substrate may vary dependent on implementation. However, the components may for example be provided in the form of printed electronics. Although the substrate itself is flexible, and whilst all of the components may also be flexible, in some examples at least some of the components may be rigid or thinned components.

As shown in FIG. 2, each first-level prediction unit 160, 170 comprises a plurality of sensors 164, 166, 168, 174, 176, 178, respectively, that each generate sensor signals indicative of a physical state of the battery cell, those signals being received by associated first-level prediction circuitry 162, 172 within each first-level prediction unit 160, 170. The sensors may take a variety of forms and may differ from one another, or at least some of the sensors may be of the same type. Each first-level prediction circuit 162, 172 is arranged to generate a predicted battery cell status value in dependence on the sensor signals received from the various sensors coupled thereto.

There are various ways in which each first-level prediction circuit 162, 172 may be arranged to determine the predicted battery cell status value from the various received sensor signals. However, in some example implementations, the first-level prediction circuitry 162, 172 has machine learning capabilities that can be configured to infer correspondences between patterns of sensor signals and different battery cell physical states, with that information for example being obtained during a training phase and stored for reference by the first-level prediction circuits during subsequent use. This ability of the first-level prediction circuitry to infer correspondences between patterns of sensor signals and different battery cell physical states may in various contexts be referred to as machine learning, artificial intelligence, smart processing, and so on, and may be based on various techniques and algorithms, such as neural networks, support vector machines, and so on.

Subsequent to the learning phase, each first-level prediction circuit could for example be arranged to consider only the sensor signals currently received from the various sensors, or instead may be arranged to look at a history of the sensor signals received over a certain period of time, and based on that information then seeks to match that pattern of sensor signals with a particular battery cell physical state, and based thereon to then generate a predicted battery cell status value.

As the various first-level prediction units 160, 170 are located at different positions on the flexible substrate, then the associated sensors provide signals indicative of a physical state in relation to an associated location on the battery cell's surface. In accordance with the techniques described herein, second-level prediction circuitry 182 is provided to monitor the various predicted battery cell status values generated by the first-level prediction circuitry of each first-level prediction unit, and based thereon to determine a prediction result for the battery cell. If that prediction result indicates anything other than that the battery cell is in its normal operating state (an in an alternative implementation even if it does indicate the normal operating state), then the second-level prediction circuitry 182 may be arranged to issue the prediction result as an output signal, using an associated communications device 188, with that output signal to be taken into account by the BMS 115 when performing its battery management functions. Depending on the location of the BMS, the output signal may be routed via control circuitry associated with the battery module containing the battery cell 150 and associated battery cell monitoring system.

Whilst the second-level prediction circuitry 182 may be arranged to merely review the latest predicted battery cell status value from each of the first-level prediction units 160, 170, in an alternative implementation a series of such predicted battery cell status values from each of the first-level prediction units 160, 170 can be stored in associated storage devices 184, 186, so that the second-level prediction circuitry 182 can then analyse a series of predicted battery cell status values when determining the appropriate prediction result. Each storage 184, 186 can take a variety of forms, but in one example implementation takes the form of a queue, thus providing an easy way for the second-level prediction circuitry to determine the relative timing of the various items of predicted battery cell status values stored in each queue.

In the example shown in FIG. 2, the battery cell monitoring system is not provided with an explicit power source, such as a printed battery, since it is assumed that the battery cell 150 being monitored will be able to provide the very modest power supply required. However, in some examples, an explicit power source could be provided as one of the components integrated into the flexible substrate.

It should be noted that the first-level prediction units 160, 170 do not need to operate in synchronisation or lockstep with each other, and both may behave differently in space and time without those differences necessarily meaning one is faulty.

Whilst in FIG. 2 two first-level prediction units 160, 170 are shown, in alternative implementations more than two first-level prediction units may be provided. The second-level prediction unit 180 may then be arranged to monitor the predicted battery cell status values produced by each of the first-level prediction units when determining the prediction result for the battery cell 150. Further, whilst in one example implementation the second-level prediction circuitry 182 is provided within a single second-level prediction unit 180, in alternative implementations, as will be discussed later with reference to FIGS. 9A and 9B, the second-level prediction circuitry may actually be provided by multiple second-level prediction units, with those second-level prediction units operating in combination to determine the prediction result.

Figure 3:
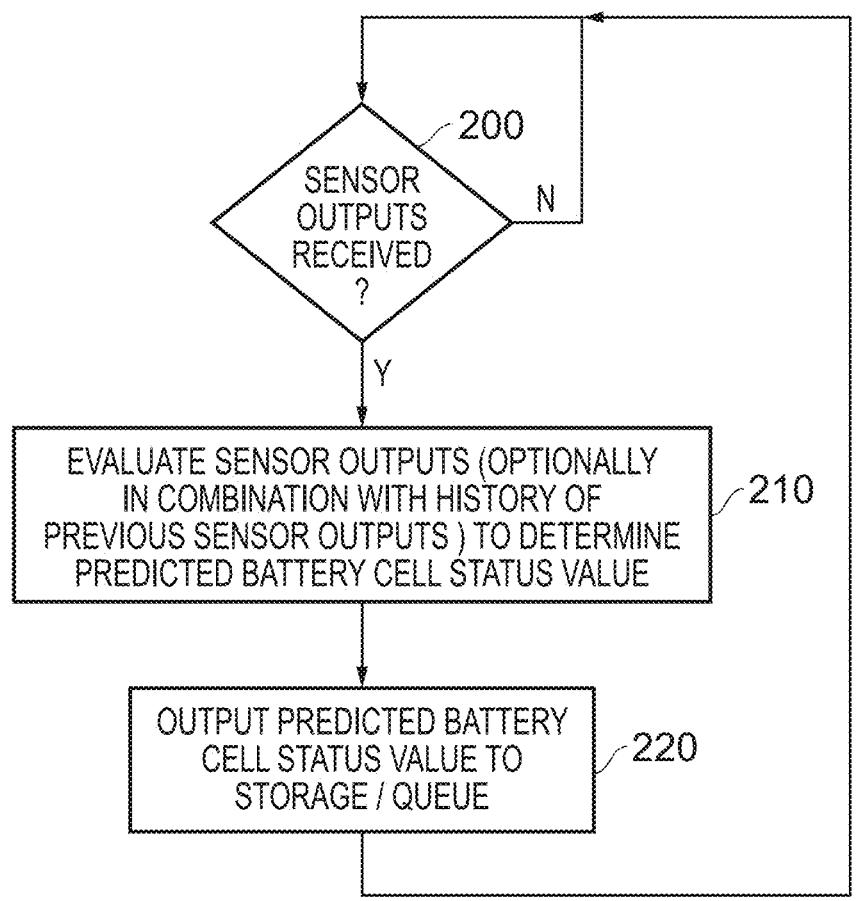
FIG. 3 is a flow diagram illustrating the operation of each first-level prediction unit of FIG. 2, in accordance with one example implementation.

FIG. 3 is a flow diagram illustrating the operation of each first-level prediction unit. At step 200, it is determined whether new sensor outputs have been received from the various sensors of that first-level prediction unit. If so, then the process proceeds to step 210, where the first-level prediction circuitry 162, 172 of the first-level prediction unit 160, 170 evaluates the sensor outputs in order to determine a predicted battery cell status value. As noted in step 210, this may optionally involve evaluating the latest sensor outputs in combination with a history of previous sensor outputs. As mentioned earlier, there are various ways in which the first-level prediction circuitry may be configured to determine a predicted battery cell status value from the various sensor output values, but in one example implementation a machine learning process may have been used in order to infer correspondences between the patterns of sensor signals and various different battery cell physical states. Once the sensor outputs have been evaluated at step 210, then the predicted battery cell status value is output at step 220 for storage in the associated storage element/queue 184, 186.

Figure 4:
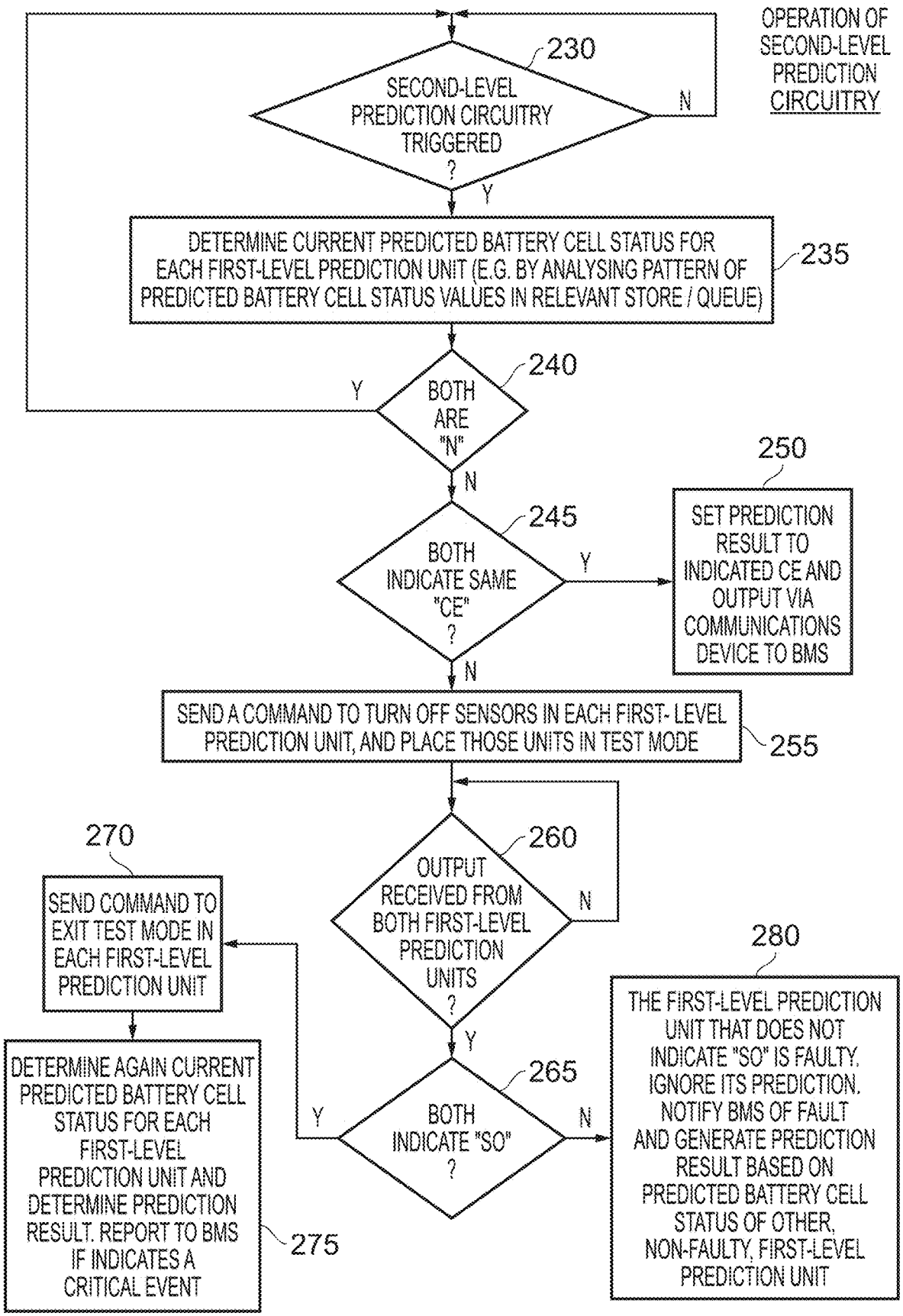
FIG. 4 is a flow diagram illustrating the operation of the second-level prediction circuitry of FIG. 2 in accordance with one example implementation.

FIG. 4 is a flow diagram illustrating the operation of the second-level prediction circuitry 182 in accordance with one example implementation. At step 230, it is determined whether the second-level prediction circuitry has been triggered to perform an analysis. There are various ways in which the second-level prediction circuitry could be triggered, but in one example implementation it is triggered every N clock cycles, where N is an integer of one or more.

Once the second-level prediction circuitry has been triggered, then at step 235 the second-level prediction circuitry is arranged to determine a current predicted battery cell status for each first-level prediction unit. There are various ways in which this can be achieved, but in one example implementation this is done by analysing the pattern of predicted battery cell status values in the relevant storage unit/queue 184, 186. For example, a majority voting approach could be taken, such that the current predicted battery cell status for a given first-level prediction unit is that indicated by the most status values in the associated queue 184, 186, or alternatively the analysis operation may be biased towards the most recent status value or status values within the associated queue 184, 186, for example if those most recent status value or values indicate a critical event. As another alternative approach, at step 235 the second-level prediction circuitry may merely pop the oldest entry from the relevant queue and use that to form the current predicted battery cell status.

At step 240, it is then determined whether the current predicted battery cell status for each first-level prediction unit indicates the normal state of operation. If so, no further action is taken and the process returns to step 230 to await the second-level prediction circuitry being re-triggered at some future point in time. However, if at step 240 it is determined that the current predicted battery cell status is not the normal state for both first-level prediction units, then the process proceeds to step 245, where it is determined whether the current predicted battery cell status for each first-level prediction unit indicates the same critical event. If so, the process proceeds to step 250 where the prediction result is set to indicate that critical event, and an output signal is generated via the communications device 188 to provide that prediction result to the BMS 115.

If at step 245 it is determined that not both of the current predicted battery cell statuses indicate the same critical event, then at step 255 a check operation is initiated before determining the prediction result, in order to seek to assess whether each of the first-level prediction units is operating correctly. This check operation can take a variety of forms, but in the example shown in FIG. 4 is initiated by sending a command to each of the first-level prediction units to cause those first-level prediction units to turn off their sensors, and to place each of those units into a test mode. At step 260, it is then determined whether an output has been received from both of the first-level prediction units. When in the test mode, each first-level prediction unit should generate an output that indicates that the sensors are turned off, assuming the first-level prediction circuitry is operating correctly. Hence, once an output has been received from each of the first-level prediction units, then at step 265 it is determined whether both of those outputs indicate the sensors off (SO) state.

If that is the case, then the process proceeds to step 270 where a command is sent to each of the first-level prediction units 160, 170 to cause those units to exit the test mode. Thereafter, the process proceeds to step 275 where the second-level prediction circuitry 182 again determines a current predicted battery cell status for each first-level prediction unit and then determines the prediction result on the basis of those current predicted battery cell statuses. If the prediction result indicates a critical event, then that critical event is reported to the BMS 115.

There are various ways in which the determination at step 275 can be performed. In one example implementation, the contents of each of the queues 184, 186 is reset, a new predicted battery cell status value is awaited from each first-level prediction unit, and then the prediction result is based on the new predicted battery cell status value received from each first-level prediction unit. Such an approach can enable a fast decision to be made. However, if desired the second-level prediction circuitry may wait for each of the queues 184, 186 to be populated with multiple new predicted battery cell status values from each first-level prediction unit before determining a prediction result. As yet further alternative options, at step 275 the second-level prediction circuitry 182 may merely re-evaluate the current contents of each queue 184, 186 without those queue contents being reset, or evaluate those existing contents in combination with the new predicted battery cell status value received from each first-level prediction unit.

If at step 265, it is determined that not both of the outputs received from the first-level prediction units indicate the "sensors off" state, then the process proceeds to step 280 where it is determined that any first-level prediction unit that has not produced an output indicating the sensors off state is faulty. Accordingly, at step 280 any output from such a faulty first-level prediction unit is ignored, and instead the second-level prediction circuitry is arranged to determine the prediction result from any non-faulty first-level prediction unit. When determining the prediction result at this stage, the same options may be used as discussed earlier in relation to step 275.

If desired, at step 280 the second-level prediction circuitry may also issue an output signal via the communications device 188 to identify to the BMS 115 the occurrence of the fault, for example by identifying which first-level prediction unit(s) has been determined to be faulty.

Figure 5A:
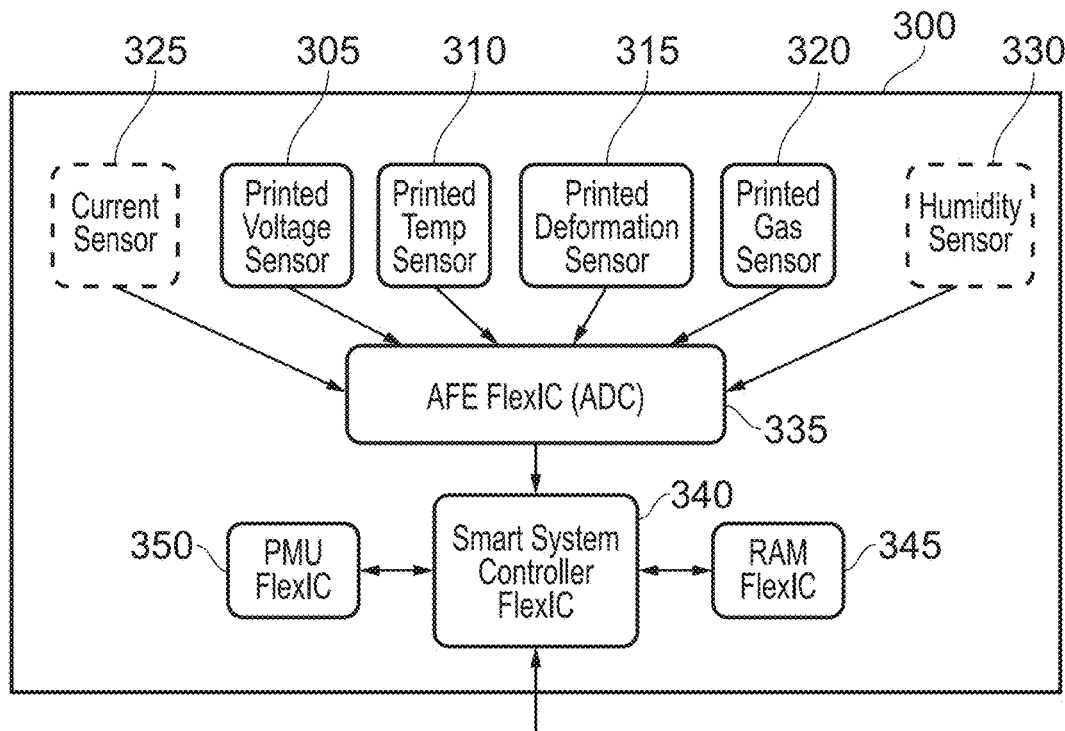
FIGS. 5A and 5B are block diagrams illustrating components provided within the first-level prediction unit and the second-level prediction unit, respectively, in accordance with one example implementation.

FIG. 5A is a block diagram illustrating components provided within a first-level prediction unit 300. A variety of different sensors 305, 310, 315, 320 may be provided. In particular, in the example implementation shown a voltage sensor 305, a temperature sensor 310, a deformation sensor 315 (also known as a strain sensor), and a gas sensor 320 are provided. The strain sensor 315 will detect any deformity such as swelling in the cell close to that sensor. Any deformity can be an indicator of an upcoming critical event such as a crack, burst or gas leakage. The gas sensor 320 can be tuned to detect gases and volatiles from the cell. The combination of temperature, deformation and gas sensing can be used to predict such critical events before they happen. As also shown, it can also be useful to be provided with an indication of the current voltage of the battery cell. If desired, one or more other sensors may also be provided, such as a current sensor 325 or a humidity sensor 330.

The outputs from the various sensors are routed via an analogue front end (AFE) flexible component 335 which acts as an analogue to digital converter (ADC) in order to generate signal values that can then be passed onto the smart system controller flexible integrated circuit 340 shown in FIG. 5A. The operation of the smart system controller 340 can be controlled by a power management unit 350, and the smart system controller 340 may have access to storage such as a random access memory (RAM) component 345 during the performance of its operations. In addition to performing book-keeping tasks such as temporarily storing the sensor output signals in the RAM 345, the smart system controller 340 will also implement the functionality of the earlier described first-level prediction circuitry, either by running appropriate software, or by custom machine learning hardware provided within the system controller. During this process, the prediction circuitry may access data within the RAM 345 used to correlate sensor outputs with predicted battery cell status values. Each predicted battery cell status value generated by the first-level prediction circuitry within the smart system controller 340 may be output from the first-level prediction unit 300 for storage in the associated queue 184, 186 accessible to the second-level prediction circuitry 182.

Figure 5B:
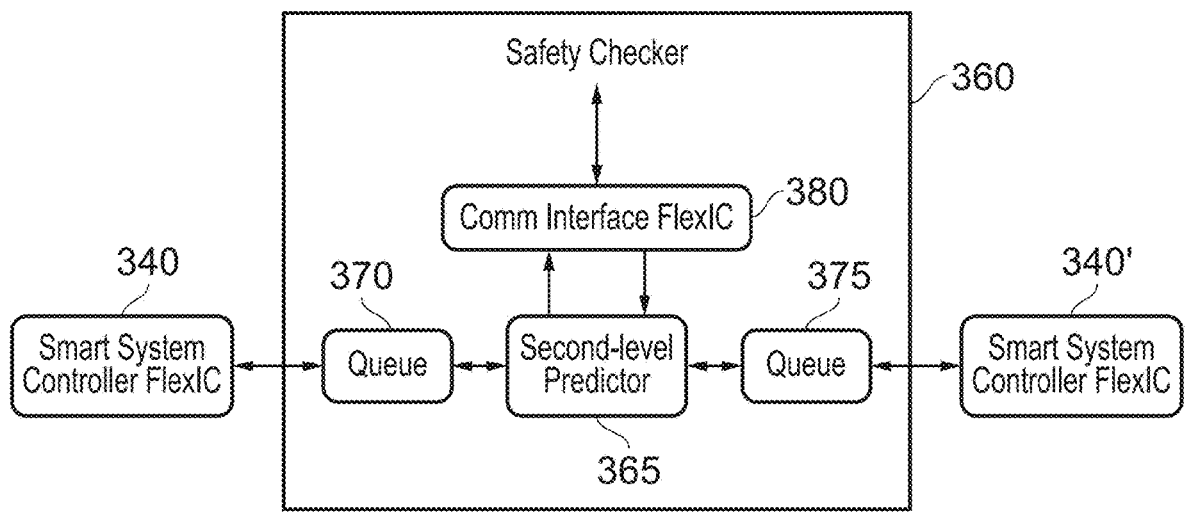

FIG. 5B is a block diagram illustrating components provided within a safety checker 360 forming the second-level prediction unit 180 in accordance with one example implementation. As shown in FIG. 5B, the predicted battery cell status values generated by each smart system controller 340, 340' are received into corresponding queues 370, 375 that are accessible to the second-level prediction circuitry 365 provided within the safety checker 360. The second-level prediction circuitry 365 then performs the process discussed earlier in order to analyse the current contents of the two queues 370, 375, in order to determine a prediction result based thereon. At least when the prediction result indicates an occurrence of a critical event, the second-level prediction circuitry 365 then causes the communications interface circuitry 380 to generate an output indicating that critical event, and as discussed earlier that output can be forwarded on to the BMS 115.

Figure 6:
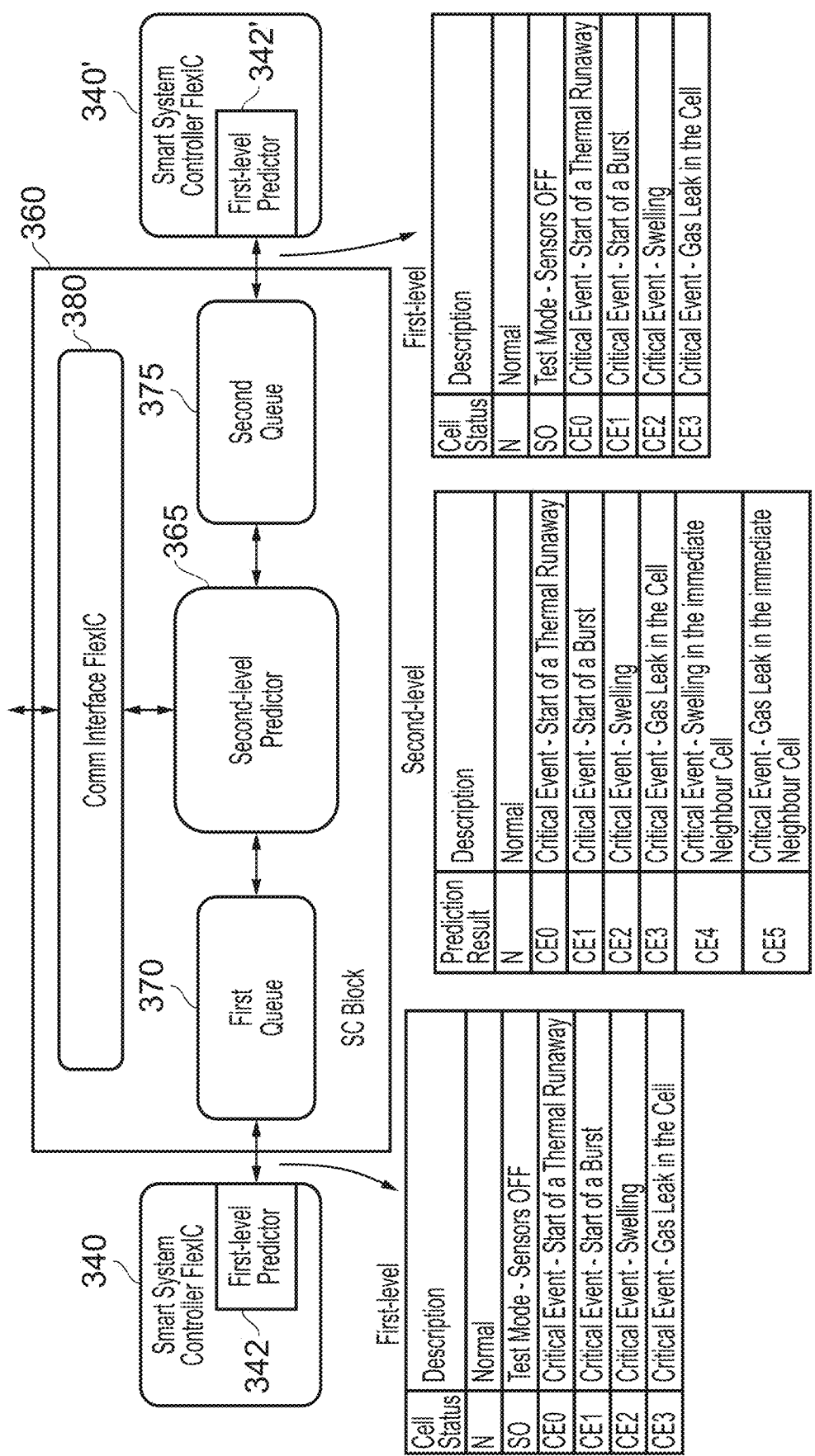
FIG. 6 is a block diagram schematically illustrating how different critical events may be detected by the battery cell monitoring system in accordance with one example implementation.

FIG. 6 is a diagram schematically illustrating various critical events that may be detected within the battery cell monitoring system described herein. Each of the smart system controllers 340, 340' implementing the first-level prediction circuitry 342, 342' of each first-level prediction unit 160, 170 may generate predicted battery cell status values that either indicate the normal state, or one of a number of different critical events. In the particular example shown, four potential critical events may be indicated by each first-level predictor 342, 342'. In particular, the critical event CE0 indicates a start a thermal runaway, the critical event CE1 indicates the start of a burst/crack, the critical event CE2 indicates swelling, and the critical event CE3 indicates a gas leak in the cell.

As shown in FIG. 6, the second-level prediction circuitry 365, when analysing the contents of the queues 370, 375, may potentially derive additional critical events, as a result of contacting one or more neighbouring battery cells that also include a battery cell monitoring system. In particular, it is possible that a potential swelling event detected by one or more of the smart system controllers 340, 340' could be due to swelling in the associated battery cell, or in fact due to swelling in an adjacent cell (for example swelling in an adjacent cell may be causing a signal to be generated by the deformation sensor in the current cell, due to the closely packed nature of the various battery cells within a battery module). Similarly, a gas leak event detected by one or both of the smart system controllers 340, 340' could be due to a gas leak in the associated battery cell, or due to a gas leak in an adjacent cell. In both of these instances, the second-level prediction circuitry 365 can be arranged to communicate with one or more adjacent cells in order to assess the appropriate critical event to signal as the prediction result. This will be discussed further with reference to the flow diagram of FIG. 8.

Figure 7:
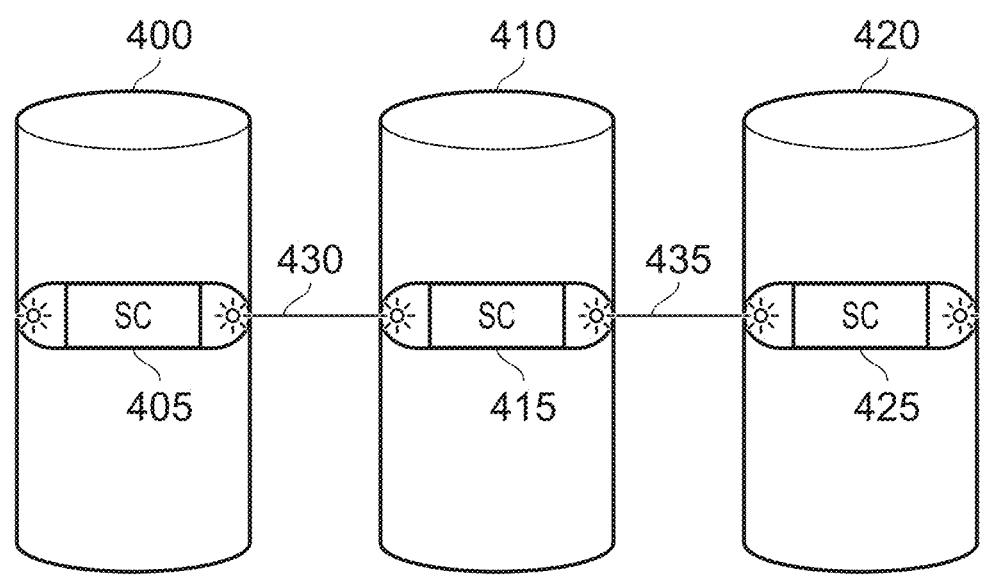
FIG. 7 schematically illustrates how battery cell monitoring systems provided on adjacent battery cells may be arranged to communicate with each other, in accordance with one example implementation.

There are various mechanisms by which the safety checker block 360 may communicate with battery cell monitoring systems provided for adjacent battery cells. For example, the communications interface 380 may allow for communication with adjacent battery cells, as indicated schematically in FIG. 7. In this example, adjacent battery cells 400, 410, 420 each have a battery cell monitoring system 405, 415, 425 provided thereon, and the safety checker (SC) block of each battery cell monitoring system may deploy its communications interface to send queries to adjacent cells, as indicated schematically by the communication paths 430, 435 in FIG. 7. Any suitable communication medium may be used, but in one example implementation the communications interface 380 is arranged to couple to optical devices used to communicate optically between adjacent battery cells. The use of an optical signal allows for electrical isolation between the various battery cell monitoring systems, and can avoid the generation of electromagnetic interference when performing communication between battery cell monitoring systems.

Figure 8:
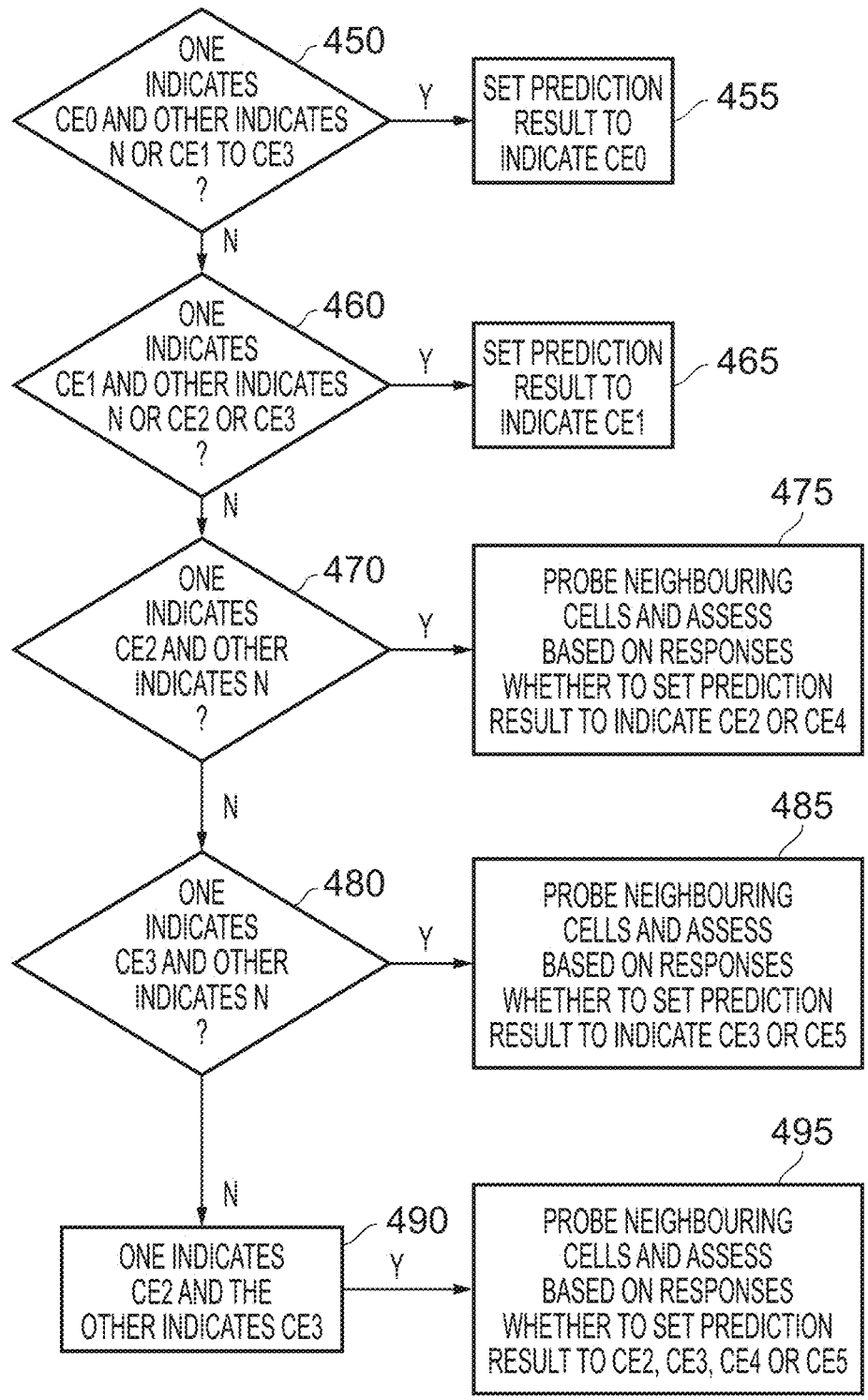
FIG. 8 is a flow diagram illustrating how a prediction result may be determined by the second-level prediction circuitry in a situation where the current predicted battery cell status determined for each first-level prediction unit is not the same, in accordance with one example implementation.

FIG. 8 is a flow diagram illustrating how the second-level prediction circuitry 365 shown in FIG. 6 may determine the prediction result if the current predicted battery cell status for each first-level prediction unit is different. In particular, with reference to the earlier described FIG. 4, it will be appreciated that if the current predicted battery cell status for each first-level prediction unit is the same, then this will either be due to both predicted battery cell statuses indicating the normal state, in which case no action is required, or both indicating the same critical event, in which case the prediction result is set to indicate that critical event. In the event that the current predicted battery cell status for each first-level prediction unit is different, then as discussed earlier with reference to FIG. 4 a check operation will be performed, and for the purposes of the discussion of FIG. 8 it will be assumed that that check has been performed, and that both first-level prediction units have been confirmed as operating correctly. Accordingly, each first-level prediction unit will have exited the test mode and started to generate new predicted battery cell status values from which the second-level prediction circuitry can then generate the current predicted battery cell status for each first-level prediction unit considered in FIG. 8.

If at step 450, it is determined whether one of those current predicted battery cell statuses indicates critical event CE0, and the other indicates either the normal state or critical events 1 to 3. If so, then in the example approach shown in FIG. 8 the prediction result is set at step 455 to indicate the critical event CE0 since CE0 is considered to be the highest priority critical event. In particular, in this example implementation, a potential thermal runaway is considered to be the most critical event, and hence is the prediction result generated at step 455.

If the condition indicated in step 450 is not present, then at step 460 it is determined whether one of the current predicted battery cell statuses indicates the critical event CE1 whilst the other indicates either the normal state or critical events 2 or 3. If that is the case, then the process proceeds to step 465 where the prediction result is set to indicate the critical event CE1. In particular, in this example implementation the critical event CE1 is considered to have a higher priority than either the critical event CE2 or the critical event CE3.

If the condition indicated in step 460 is not present, then it is determined at step 470 whether one of the current predicted battery cell statuses indicates the critical event CE2 and the other indicates the normal state. If so, the process proceeds to step 475, where the battery cell monitoring system probes one or more neighbouring battery cells in order to obtain from those neighbouring cells status information indicative of a state of those adjacent battery cells. The status information requested can take a variety of forms. For example, it could take the form of one or more predicted battery cell status values generated by the various first-level prediction circuits within the battery cell monitoring system of an adjacent battery cell, could take the form of the predicted battery cell statuses determined by the second-level prediction circuitry within the battery cell monitoring system of an adjacent battery cell, or could take the form of the prediction result produced by the second-level prediction circuitry for the adjacent battery cell if that prediction result is available. Based on the responses, the second-level prediction circuitry 365 is then arranged to determine whether to indicate as the prediction result either the critical event CE2 or the critical event CE4, in dependence on whether it predicts that the swelling is occurring in its own associated battery cell, or within a neighbouring battery cell.

If the condition indicated in step 470 is not present, then the process proceeds to step 480 where it is determined whether one of the current predicted battery cell statuses indicates the critical event CE3 and the other indicates the normal state. If so, the process proceeds to step 485, where the battery cell monitoring system probes one or more neighbouring battery cells in order to obtain from those neighbouring cells status information indicative of a state of those adjacent battery cells. Here, the same process is employed as discussed earlier in relation to step 475. Based on the responses, the second-level prediction circuitry 365 is then arranged to determine whether to indicate as the prediction result either the critical event CE3 or the critical event CE5, in dependence on whether it determines that the gas leak is occurring in its own associated battery cell, or within a neighbouring battery cell.

If the condition indicated in step 480 is not present, then in the example shown in FIG. 8 the process proceeds to step 490 where at this point it is known that one of the predicted battery cell statuses indicates the critical event CE2 and the other indicates the critical event CE3. At this point, the battery cell monitoring system probes one or more neighbouring battery cells in order to obtain from those neighbouring cells status information indicative of the state of those adjacent battery cells. Again, the same process can be employed as discussed earlier in relation to step 475. Based on the responses, the second-level prediction circuitry 365 is then arranged to determine whether to indicate as the prediction result the critical event CE2, CE3, CE4 or CE5.

Whilst for ease of illustration the flow diagram of FIG. 8 illustrates the process as a sequential series of steps, in an alternative implementation the evaluation of the states indicated by each predicted battery cell status can be performed in parallel (effectively merging steps 450, 460, 470, 480, 490), with the appropriate actions then being taken dependent on that evaluation.

Figure 9A:
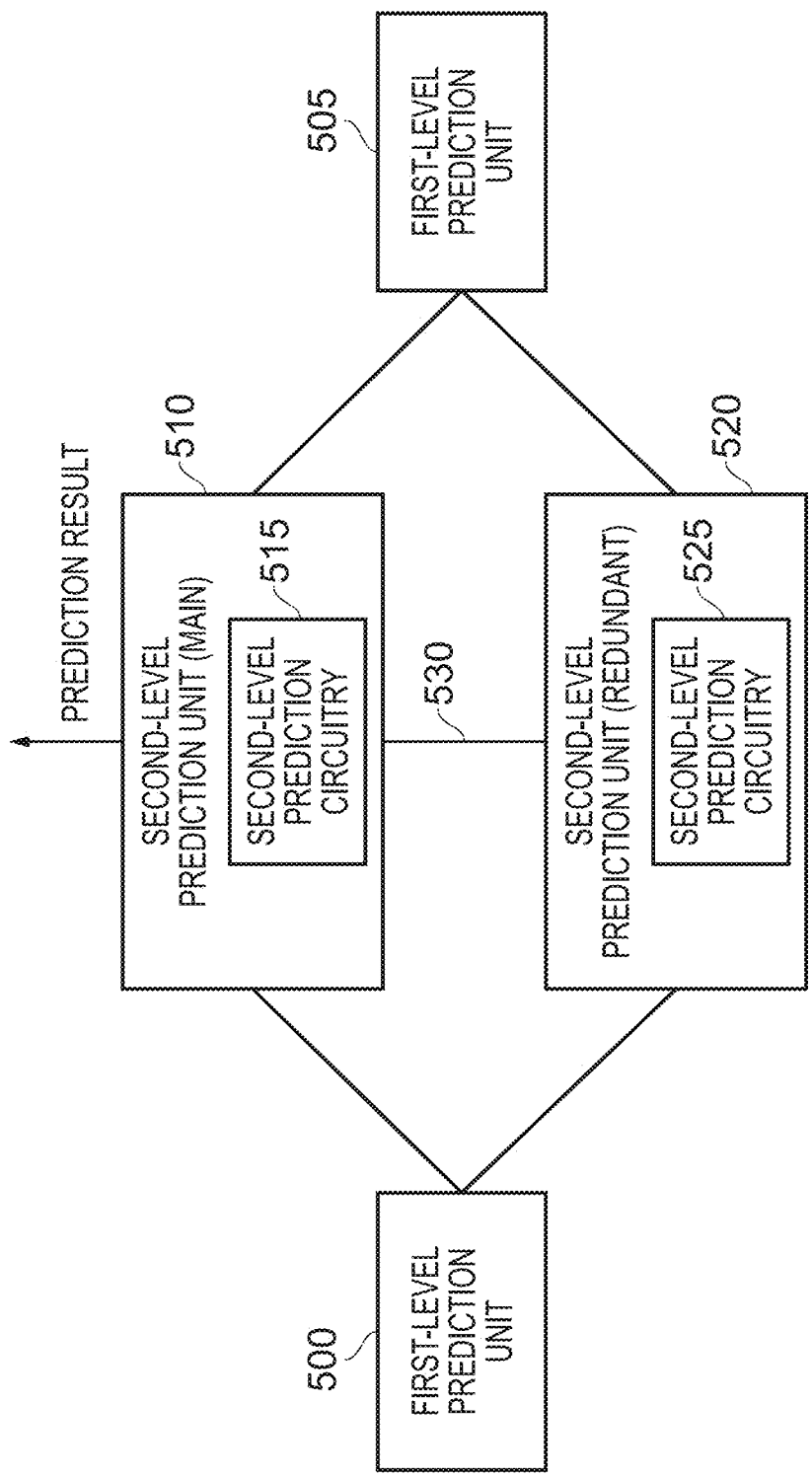
FIGS. 9A and 9B schematically illustrate how the second-level prediction circuitry of a battery cell monitoring system may be provided by multiple second-level prediction units, in accordance with alternative implementations.

Whilst in one example implementation the second-level prediction circuitry may be provided by a single second-level prediction unit, in an alternative implementation the second-level prediction circuitry may be provided by multiple second-level prediction units that operate in combination to determine the prediction result. Two such example implementations are illustrated schematically in FIGS. 9A and 9B. In the example of FIG. 9A, two second-level prediction units 510, 520 are provided, each of which comprises second-level prediction circuitry 515, 525. Each of the second-level prediction units 510, 520 monitor the outputs from the same first-level prediction units 500, 505 (only two first-level prediction units are shown but there could be more than two such units provided), and hence the second-level prediction unit 520 can be viewed as a redundant unit operating in parallel with the second-level prediction unit 510, which can be considered to be the main unit. Each of the two second-level prediction units may communicate with each other via path 530, so that for example the main second-level prediction unit 510 can check that the redundant second-level prediction unit is producing the same prediction result. This can provide a further level of qualification before the prediction result is output to the BMS 115.

There are a number of different techniques that could be adopted if it is determined that the main second-level prediction unit 510 and the redundant second-level prediction unit 520 are not producing the same prediction result. For example, they could both be arranged to enter a test mode in a similar way to that discussed earlier in connection with the first-level prediction units. In the test mode, the second-level prediction units can be arranged to send a predetermined test status to each other so that they can compare their respective test statuses. If the test statuses do not match but one of the test statuses is correct, then the other one must be faulty. In that case, the functional second-level prediction unit can be arranged to send a message to the BMS.

If the test statuses of both units do not match and neither of them is correct (or they do match but neither is correct), then this indicates that both are faulty, and in such a scenario both units can be arranged to attempt to notify the BMS. However, if the fault is such that it prevents that form of communication, then a fallback mechanism may be employed. For example, there may be a watchdog timer mechanism implemented in the BMS, such that if the BMS does not receive any status information from a battery cell monitoring system for a period of time, then it will time out and decide that the battery cell monitoring system is faulty and take a determined action, e.g. disable the entire battery cell.

If after the above-mentioned test it is determined that neither of the second-level prediction units are faulty but their prediction results still do not match, then the main second-level prediction unit can send a message to the BMS, telling it what happened, and leave the decision to the BMS as to what action to take in such a situation.

In an alternative implementation, the above described cross-checking mechanism may not be employed, and instead the BMS may merely be notified of the discrepancy between the prediction results of the two second-level prediction units. In this case, both second-level prediction units could be arranged to send a message to the BMS explaining that there is a prediction result mismatch, and let the BMS decide what to do.

Figure 9B:
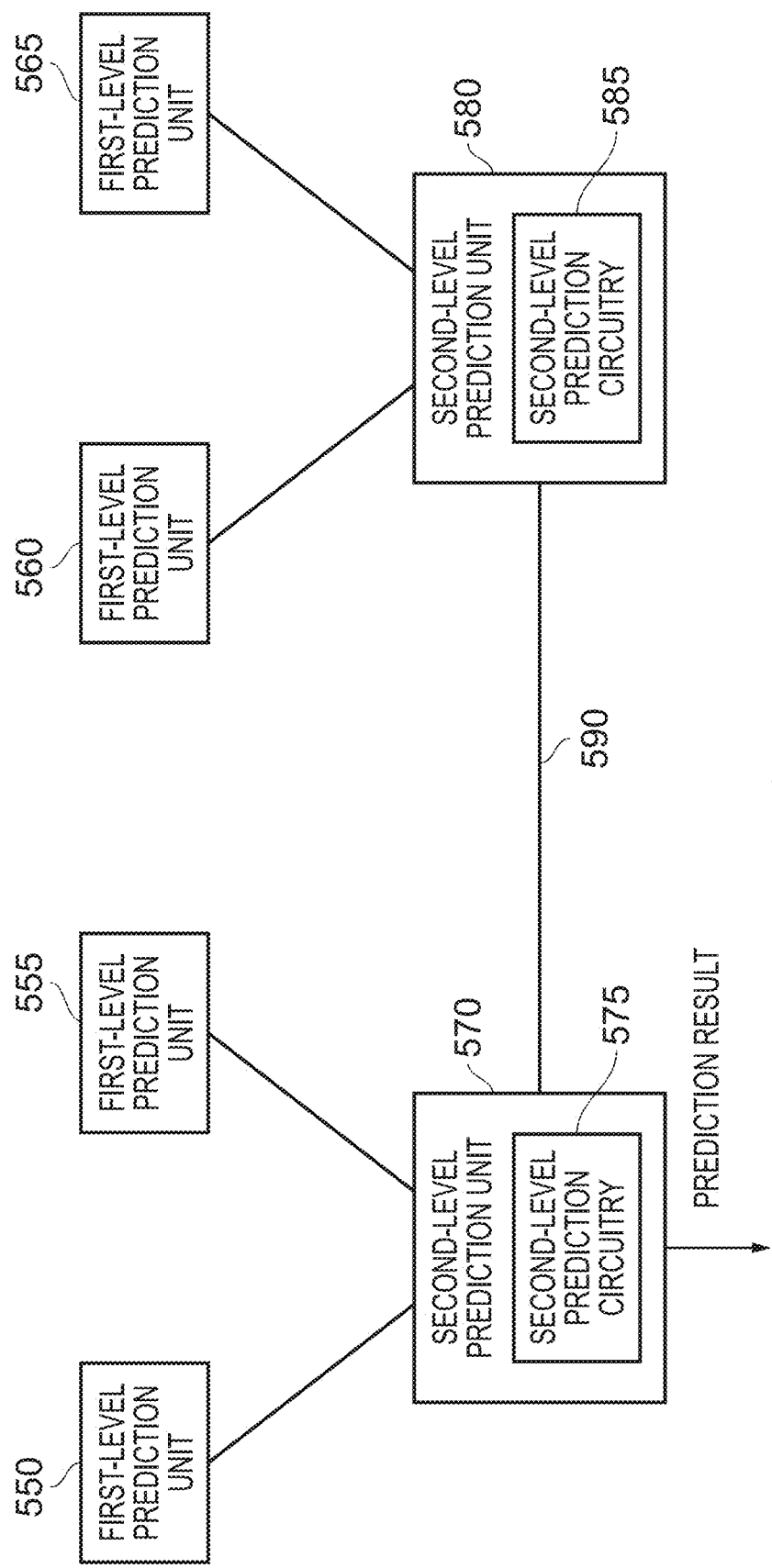

FIG. 9B illustrates an alternative implementation where there are more than two first-level prediction units 550, 555, 560, 565, and where different second-level prediction units 570, 580 are associated with each pair of first-level prediction units. Each second-level prediction unit 570, 580 includes associated second-level prediction circuitry 575, 585, and those second-level prediction circuits communicate with each other (as indicated schematically by the communication path 590) in order to make a collaborative decision as to the appropriate prediction result to report. One of those second-level prediction units can then be arranged to output the prediction result, at least when that prediction result indicates the presence of a critical event.

Whilst in both FIGS. 9A and 9B only two second-level prediction units are shown, in other example implementations more than two second-level prediction units may be employed.

Concepts described herein may be embodied in computer-readable code for fabrication of an apparatus that embodies the described concepts. For example, the computer-readable code can be used at one or more stages of a design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define a HDL representation of the one or more logic circuits embodying the apparatus in Verilog, SystemVerilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioural representations of the concepts that can be interpreted by a computer to enable simulation, functional and/or formal verification, and testing of the concepts.

Additionally, or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively, or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively, or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

It will be appreciated that the techniques described herein provide a significantly improved mechanism for monitoring the status of battery cells. In particular, a battery cell monitoring system is provided that can be associated with an individual battery cell within a larger system, such as a battery pack or battery module that may comprise multiple battery cells. The battery cell monitoring system can be provided on a flexible substrate enabling it to conform to the surface of a battery cell to be monitored. Further, information indicative of a physical state of the battery cell can be obtained from various locations adjacent the surface of the battery cell, with an overall prediction result being generated based on the information obtained from those various locations. At least when the prediction result indicates occurrence of a critical event, that prediction result can be output for receipt by a centralised battery management system. This can allow early detection of potential safety-critical events, for example the beginning of a thermal runaway, cracks, bursts, gas leaks, etc., with those events being notified to a battery management system to allow safety-critical decisions to be taken dependent on those notified events.

Other example arrangements are set out in the following clauses:

1. A battery cell monitoring system comprising:
    a flexible substrate able to conform to a surface of a battery cell to be monitored;
    a plurality of first-level prediction units integrated onto the flexible substrate, where each first-level prediction unit is positioned at a different location on the flexible substrate to each other first-level prediction unit, and each first-level prediction unit comprises at least one sensor to generate sensor signals indicative of a physical state of the battery cell and first-level prediction circuitry to generate a predicted battery cell status value in dependence on the sensor signals received from the at least one sensor of that first-level prediction unit;
    second-level prediction circuitry arranged to determine a prediction result in dependence on the predicted battery cell status values generated by the first-level prediction circuitry of each first-level prediction unit; and
    a communications device to output the prediction result at least when the prediction result indicates an occurrence of a critical event.

2. A battery cell monitoring system as in Clause 1, wherein the second-level prediction circuitry is also integrated onto the flexible substrate.

3. A battery cell monitoring system as in Clause 1 or Clause 2, wherein the communications device is also integrated onto the flexible substrate.

4. A battery cell monitoring system as in any preceding clause, wherein the second-level prediction circuitry is arranged, responsive to being triggered to determine the prediction result:
    to determine, for each first-level prediction unit, a current predicted battery cell status based on one or more predicted battery cell status values generated by the first-level prediction circuitry of that first-level prediction unit; and
    to determine the prediction result in dependence on the current predicted battery cell status associated with at least one first-level prediction unit.

5. A battery cell monitoring system as in Clause 4, wherein the current predicted battery cell status is selected from a set of possible statuses that comprise at least a normal status and one or more critical event statuses, the normal status indicating normal operation of the battery cell, and each critical event status indicating an abnormal behaviour of the battery cell.

6. A battery cell monitoring system as in Clause 5, wherein when the current predicted battery cell status determined for each first-level prediction unit indicates a normal status, the second-level prediction circuitry is arranged to determine, as the prediction result, the normal status.

7. A battery cell monitoring system as in Clause 5 or Clause 6, wherein when the current predicted battery cell status determined for each first-level prediction unit indicates a same critical event status, the second-level prediction circuitry is arranged to determine, as the prediction result, the same critical event status, and to trigger the communication device to output that prediction result.

8. A battery cell monitoring system as in any of clauses 5 to 7, wherein when the current predicted battery cell status determined for at least one first-level prediction unit differs to the current predicted battery cell status determined for at least one other first-level prediction unit, the second-level prediction circuitry is arranged to perform a check operation before determining the prediction result.

9. A battery cell monitoring system as in Clause 8, wherein:
    the check operation implements a procedure to check whether the first-level prediction circuitry of each first-level prediction unit is operating correctly;
    the second-level prediction circuitry is arranged, when the check operation determines that the first-level prediction circuitry of each first-level prediction unit is operating correctly, to determine the prediction result using predicted battery cell statuses for each first-level prediction unit; and
    the second-level prediction circuitry is arranged, when the check operation determines that the first-level prediction circuitry of one or more first-level prediction units is faulty, to exclude predicted battery cell statuses for each faulty first-level prediction unit when determining the prediction result.

10. A battery cell monitoring system as in Clause 9, wherein each first-level prediction unit is placed in a test mode when the check operation is performed, and the check operation is arranged to cause the first-level prediction circuitry of each first-level prediction unit to generate a test mode predicted battery cell status value, where the test mode predicted battery cell status value will specify a reserved value if the first-level prediction circuitry is operating correctly.

11. A battery cell monitoring system as in Clause 10, wherein the second-level prediction circuitry is arranged, when the check operation determines that the first-level prediction circuitry of each first-level prediction unit is operating correctly, to cause each first-level prediction unit to exit the test mode and cause its associated first-level prediction circuitry to generate a further predicted battery cell status value for use by the second-level prediction circuitry in generating the prediction result.

12. A battery cell monitoring system as in any of clauses 5 to 11, wherein when at least one predicted battery cell status used to determine the prediction result indicates a single critical event and any remaining predicted battery cell statuses used to determine the prediction result indicate the normal state, the second-level prediction circuitry is arranged to identify that single critical event as the prediction result.

13. A battery cell monitoring system as in any of clauses 5 to 12, wherein:
    the set of possible statuses include a plurality of critical event statuses indicating different critical events; and
    when the predicted battery cell statuses used to determine the prediction result indicate two or more critical events, the second-level prediction circuitry is arranged to apply prioritisation criteria to determine which critical event to identify as the prediction result.

14. A battery cell monitoring system as in any of clauses 5 to 13, wherein
the set of possible statuses include a plurality of critical event statuses indicating different critical events, the plurality of critical event statuses including at least one special type critical event status that can imply a critical event in either the battery cell or an adjacent battery cell monitored by a further instance of the battery cell monitoring system; and
when at least one predicted battery cell status used to determine the prediction result indicates the at least one special type critical event status, the second-level prediction circuitry is arranged, at least when no higher priority critical event is indicated by any other predicted battery cell statuses used to determine the prediction result, to employ the communications device to request status information from the further instance of the battery cell monitoring system associated with at least one adjacent battery cell, before determining the prediction result.

15. A battery cell monitoring system as in any preceding clause, wherein when the prediction result indicates occurrence of a critical event, the communications device is arranged to output that prediction result for reception by a controller used to control a group of battery cells incorporating the battery cell being monitored by the battery cell monitoring system.

16. A battery cell monitoring system as in any of clauses 5 to 15, wherein the set of possible statuses include a plurality of critical event statuses indicating different critical events, and those different critical events comprise one or more of:
a start of a thermal runaway in the battery cell;
a start of a burst in the battery cell;
a swelling of the battery cell;
a gas leak from the battery cell.

17. A battery cell monitoring system as in any preceding clause, wherein each first-level prediction unit is arranged to output a series of predicted battery cell status values generated at different points in time by the associated first-level prediction circuitry, and the battery cell monitoring system further comprises, for each first-level prediction unit, a status value storage to hold multiple predicted battery cell status values output by that first-level prediction unit.

18. A battery cell monitoring system as in Clause 17, wherein each status value storage is arranged to enable a determination of an order in which each of the multiple predicted battery cell status values were output by the associated first-level prediction unit.

19. A battery cell monitoring system as in Clause 17 or Clause 18, wherein the second-level prediction circuitry is arranged, responsive to being triggered to determine the prediction result:
to perform an analysis operation in respect of each status value storage in order to determine a current predicted battery cell status associated with each first-level prediction unit; and
to determine the prediction result in dependence on the current predicted battery cell status associated with at least one first-level prediction unit.

20. A battery cell monitoring system as in Clause 19, wherein the analysis operation is arranged to determine the current predicted battery cell status in dependence on a pattern of the predicted battery cell status values stored in the status value storage.

21. A battery cell monitoring system as in any preceding clause, wherein the at least one sensor comprises one or more of:
a temperature sensor;
a gas emission sensor;
a physical deformation sensor;
a humidity sensor;
a voltage sensor; and
a current sensor.

22. A battery cell monitoring system as in any preceding clause, wherein the communications device is an optical device.

23. A battery cell monitoring system as in any preceding clause, wherein the second-level prediction circuitry is provided by multiple second-level prediction units that operate in combination to determine the prediction result.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. A battery cell monitoring system comprising:
a flexible substrate able to conform to a surface of a battery cell to be monitored;
a plurality of first-level prediction units integrated onto the flexible substrate, where each first-level prediction unit is positioned at a different location on the flexible substrate to each other first-level prediction unit, and each first-level prediction unit comprises at least one sensor to generate sensor signals indicative of a physical state of the battery cell and first-level prediction circuitry to generate a predicted battery cell status value in dependence on the sensor signals received from the at least one sensor of that first-level prediction unit;
second-level prediction circuitry arranged to determine a prediction result in dependence on the predicted battery cell status values generated by the first-level prediction circuitry of each first-level prediction unit; and
a communications device to output the prediction result at least when the prediction result indicates an occurrence of a critical event;
wherein the second-level prediction circuitry is arranged, responsive to being triggered to determine the prediction result:
to determine, for each first-level prediction unit, a current predicted battery cell status based on one or more predicted battery cell status values generated by the first-level prediction circuitry of that first-level prediction unit; and to determine the prediction result in dependence on the current predicted battery cell status associated with at least one first-level prediction unit;

wherein the current predicted battery cell status is selected from a set of possible statuses that comprise at least a normal status and one or more critical event statuses, the normal status indicating normal operation of the battery cell, and each critical event status indicating an abnormal behaviour of the battery cell;

wherein in response to a determination that the current predicted battery cell status determined for at least one first-level prediction unit differs from the current predicted battery cell status determined for at least one other first-level prediction unit, the second-level prediction circuitry is arranged to perform a check operation before determining the prediction result; and wherein the check operation implements a procedure to check whether the first-level prediction circuitry of each first-level prediction unit is operating correctly.

2. A battery cell monitoring system as claimed in claim 1, wherein the second-level prediction circuitry is also integrated onto the flexible substrate.

3. A battery cell monitoring system as claimed in claim 1, wherein the communications device is also integrated onto the flexible substrate.

4. A battery cell monitoring system as claimed in claim 1, wherein when the current predicted battery cell status determined for each first-level prediction unit indicates a normal status, the second-level prediction circuitry is arranged to determine, as the prediction result, the normal status.

5. A battery cell monitoring system as claimed in claim 1, wherein when the current predicted battery cell status determined for each first-level prediction unit indicates a same critical event status, the second-level prediction circuitry is arranged to determine, as the prediction result, the same critical event status, and to trigger the communication device to output that prediction result.

6. A battery cell monitoring system as claimed in claim 1, wherein:
the second-level prediction circuitry is arranged, when the check operation determines that the first-level prediction circuitry of each first-level prediction unit is operating correctly, to determine the prediction result using predicted battery cell statuses for each first-level prediction unit; and
the second-level prediction circuitry is arranged, when the check operation determines that the first-level prediction circuitry of one or more first-level prediction units is faulty, to exclude predicted battery cell statuses for each faulty first-level prediction unit when determining the prediction result.

7. A battery cell monitoring system as claimed in claim 6, wherein each first-level prediction unit is placed in a test mode when the check operation is performed, and the check operation is arranged to cause the first-level prediction circuitry of each first-level prediction unit to generate a test mode predicted battery cell status value, where the test mode predicted battery cell status value will specify a reserved value if the first-level prediction circuitry is operating correctly.

8. A battery cell monitoring system as claimed in claim 7, wherein the second-level prediction circuitry is arranged, when the check operation determines that the first-level prediction circuitry of each first-level prediction unit is operating correctly, to cause each first-level prediction unit to exit the test mode and cause its associated first-level prediction circuitry to generate a further predicted battery cell status value for use by the second-level prediction circuitry in generating the prediction result.

9. A battery cell monitoring system as claimed in claim 1, wherein when at least one predicted battery cell status used to determine the prediction result indicates a single critical event and any remaining predicted battery cell statuses used to determine the prediction result indicate the normal state, the second-level prediction circuitry is arranged to identify that single critical event as the prediction result.

10. A battery cell monitoring system as claimed in claim 1, wherein:
the set of possible statuses include a plurality of critical event statuses indicating different critical events; and
when the predicted battery cell statuses used to determine the prediction result indicate two or more critical events, the second-level prediction circuitry is arranged to apply prioritization parameters to determine which critical event to prioritize as the prediction result.

11. A battery cell monitoring system as claimed in claim 1, wherein
the set of possible statuses include a plurality of critical event statuses indicating different critical events, the plurality of critical event statuses including at least one special type critical event status that can imply a critical event in either the battery cell or an adjacent battery cell monitored by a further instance of the battery cell monitoring system; and
when at least one predicted battery cell status used to determine the prediction result indicates the at least one special type critical event status, the second-level prediction circuitry is arranged, at least when no higher priority critical event is indicated by any other predicted battery cell status used to determine the prediction result, to employ the communications device to request status information from the further instance of the battery cell monitoring system associated with at least one adjacent battery cell, before determining the prediction result.

12. A battery cell monitoring system as claimed in claim 1, wherein when the prediction result indicates occurrence of a critical event, the communications device is arranged to output that prediction result for reception by a controller used to control a group of battery cells incorporating the battery cell being monitored by the battery cell monitoring system.

13. A battery cell monitoring system as claimed in claim 1, wherein the set of possible statuses include a plurality of critical event statuses indicating different critical events, and those different critical events comprise one or more of:
a start of a thermal runaway in the battery cell;
a start of a burst in the battery cell;
a swelling of the battery cell;
a gas leak from the battery cell.

14. A battery cell monitoring system as claimed in claim 1, wherein each first-level prediction unit is arranged to output a series of predicted battery cell status values generated at different points in time by the associated first-level prediction circuitry, and the battery cell monitoring system further comprises, for each first-level prediction unit, a status value storage to hold multiple predicted battery cell status values output by that first-level prediction unit.

15. A battery cell monitoring system as claimed in claim 14, wherein each status value storage is arranged to enable a determination of an order in which each of the multiple predicted battery cell status values were output by the associated first-level prediction unit.

16. A battery cell monitoring system as claimed in claim 14, wherein the second-level prediction circuitry is arranged, responsive to being triggered to determine the prediction result:
to perform an analysis operation in respect of each status value storage in order to determine a current predicted battery cell status associated with each first-level prediction unit; and
to determine the prediction result in dependence on the current predicted battery cell status associated with at least one first-level prediction unit.

17. A battery cell monitoring system as claimed in claim 16, wherein the analysis operation is arranged to determine the current predicted battery cell status in dependence on a pattern of the predicted battery cell status values stored in the status value storage.

18. A battery cell monitoring system as claimed in claim 1, wherein the at least one sensor comprises one or more of:
a temperature sensor;
a gas emission sensor;
a physical deformation sensor;
a humidity sensor;
a voltage sensor; and
a current sensor.

19. A battery cell monitoring system as claimed in claim 1, wherein the communications device is an optical device.

20. A battery cell monitoring system as claimed in claim 1, wherein the second-level prediction circuitry is provided by multiple second-level prediction units that operate in combination to determine the prediction result.

21. A battery pack comprising:
a plurality of battery modules, wherein each battery module comprises a plurality of battery cells and wherein at least one of the plurality of battery cells comprises the battery cell monitoring system as claimed in claim 1; and
a battery pack management system comprising reception circuitry configured to receive each prediction result transmitted by the communications device of the battery cell monitoring system.

22. A method of monitoring a battery cell, comprising:
providing a flexible substrate able to conform to a surface of the battery cell;
integrating a plurality of first-level prediction units onto the flexible substrate, where each first-level prediction unit is positioned at a different location on the flexible substrate to each other first-level prediction unit;
generating sensor signals from at least one sensor provided in each first-level prediction unit, where the sensor signals are indicative of a physical state of the battery cell;
employing first-level prediction circuitry in each first-level prediction unit to generate a predicted battery cell status value in dependence on the sensor signals received from the at least one sensor of that first-level prediction unit;
employing second-level prediction circuitry to determine a prediction result in dependence on the predicted battery cell status values generated by the first-level prediction circuitry of each first-level prediction unit; and
outputting the prediction result at least when the prediction result indicates an occurrence of a critical event;
wherein responsive to being triggered, employing the second-level prediction circuitry to determine the prediction result by:
determining, for each first-level prediction unit, a current predicted battery cell status based on one or more predicted battery cell status values generated by the first-level prediction circuitry of that first-level prediction unit; and
determining the prediction result in dependence on the current predicted battery cell status associated with at least one first-level prediction unit;
selecting the current predicted battery cell status from a set of possible statuses that comprise at least a normal status and one or more critical event statuses, the normal status indicating normal operation of the battery cell, and each critical event status indicating an abnormal behaviour of the battery cell;
wherein in response to the current predicted battery cell status determined for at least one first-level prediction unit differing from the current predicted battery cell status determined for at least one other first-level prediction unit, employing the second-level prediction circuitry to perform a check operation before determining the prediction result; and
wherein the check operation implements a procedure to check whether the first-level prediction circuitry of each first-level prediction unit is operating correctly.

23. A non-transitory computer-readable medium to store computer-readable code for fabrication of an apparatus to form a battery cell monitoring system comprising:
a flexible substrate able to conform to a surface of a battery cell to be monitored;
a plurality of first-level prediction units integrated onto the flexible substrate, where each first-level prediction unit is positioned at a different location on the flexible substrate to each other first-level prediction unit, and each first-level prediction unit comprises at least one sensor to generate sensor signals indicative of a physical state of the battery cell and first-level prediction circuitry to generate a predicted battery cell status value in dependence on the sensor signals received from the at least one sensor of that first-level prediction unit;
second-level prediction circuitry arranged to determine a prediction result in dependence on the predicted battery cell status values generated by the first-level prediction circuitry of each first-level prediction unit; and
a communications device to output the prediction result at least when the prediction result indicates an occurrence of a critical event;
wherein the second-level prediction circuitry is arranged, responsive to being triggered to determine the prediction result:
to determine, for each first-level prediction unit, a current predicted battery cell status based on one or more predicted battery cell status values generated by the first-level prediction circuitry of that first-level prediction unit; and
to determine the prediction result in dependence on the current predicted battery cell status associated with at least one first-level prediction unit;
wherein the current predicted battery cell status is selected from a set of possible statuses that comprise at least a normal status and one or more critical event statuses, the normal status indicating normal operation of the battery cell, and each critical event status indicating an abnormal behaviour of the battery cell;
wherein in response to a determination that the current predicted battery cell status determined for at least one first-level prediction unit differs from the current predicted battery cell status determined for at least one other first-level prediction unit, the second-level prediction circuitry is arranged to perform a check operation before determining the prediction result; and wherein the check operation implements a procedure to check whether the first-level prediction circuitry of each first-level prediction unit is operating correctly.

\* \* \* \* \*